United States Patent [19]

Tokunaga et al.

[11] 4,364,017
[45] Dec. 14, 1982

[54] ELASTIC SURFACE WAVE DEVICE

[75] Inventors: Shizuo Tokunaga; Takushi Yamada, both of Hyogo; Kazuhisa Yabukawa, Himeji; Shigeyuki Kita, Hyogo; Tomoyoshi Yase, Tatsuno, all of Japan

[73] Assignee: Tokyo Shibaura Denki Kabushiki Kaisha, Kawasaki, Japan

[21] Appl. No.: 217,147

[22] Filed: Dec. 16, 1980

[30] Foreign Application Priority Data

Dec. 20, 1979 [JP] Japan ............................... 54-164752

[51] Int. Cl.$^3$ ...................... H03H 9/64; H03H 9/68; H03H 9/09; H03H 9/25
[52] U.S. Cl. ................................ 333/194; 310/313 R; 333/151
[58] Field of Search ................................ 333/150–155, 333/193–196; 29/25.35; 310/313 R, 313 A, 313 B, 313 C, 313 D; 331/107 A; 330/5.5

[56] References Cited

U.S. PATENT DOCUMENTS 4,028,646  6/1977  Ikushima et al. ............... 333/194 X
4,234,859 11/1980  Ikushima et al. ................... 333/151

FOREIGN PATENT DOCUMENTS 54-143091 11/1979 Japan .

Primary Examiner—Marvin L. Nussbaum
Attorney, Agent, or Firm—Cushman, Darby & Cushman

[57] ABSTRACT

An elastic surface wave device comprises a piezoelectric substrate having an input electrode and an output electrode on the surface, said input and output electrodes being in comb shape and opposing each other; a sound absorbing resin layer formed on at least part of the bottom surface of said piezoelectric substrate; and an adhesive resin layer in contact with said sound absorbing resin layer and said piezoelectric substrate for adhering said piezoelectric substrate to a stem.

9 Claims, 9 Drawing Figures

ELASTIC SURFACE WAVE DEVICE

BACKGROUND OF THE INVENTION

The present invention relates to an elastic surface wave device and, more particularly, to an elastic surface filter used as a frequency-selective filter.

An elastic surface wave filter is generally constructed as shown in FIG. 1 wherein a piezoelectric substrate 4 is adhered to the surface of a stem 1, and an input electrode 2 and an output electrode 3 are formed in a comb shape on the surface of the piezoelectric substrate 4 to oppose each other at a predetermined distance. Stem leads 5 extending through the stem 1 are bonded by wires 6 to these electrodes on the substrate, and a shell 7 covers the upper surface of the stem 1.

When such a surface wave filter operates, an electric signal is converted into an elastic surface wave by the input electrode, it propagates along the piezoelectric substrate towards the output electrode, and an electric signal is obtained from the output electrode. In this case, the surface wave propagates on the surface of the substrate. Further, an unnecessary bulk wave that propagates inside the substrate is generated.

The characteristics of the surface wave filter may be improved by eliminating the bulk wave as much as possible, and various methods have been proposed for suppressing the bulk wave. For example, it has been proposed to roughen the bottom surface of the piezoelectric substrate (surface on which the electrodes are not formed) by mechanical means or the like, or to form grooves thereon. It is also possible to make the piezoelectric substrate thicker to absorb and suppress the bulk wave. All these methods adopt a structure for absorbing the bulk wave inside the substrate, and the processing precision of the piezoelectric substrate contributes to the suppressing effects of the bulk wave.

However, with these methods, cracks in the piezoelectric substrate tend to occur more frequently, much labor is required for obtaining a roughened surface, and the variation in the yield is significant. The thickened piezoelectric substrate also leads to an increase in the manufacturing cost which is particularly disadvantageous for mass production.

SUMMARY OF THE INVENTION

It is, therefore, the primary object of the present invention to provide an elastic surface wave device which is capable of suppressing the bulk wave efficiently.

In order to accomplish the above and other objects, the present invention provides an elastic surface wave device comprising: a piezoelectric substrate having an input electrode and an output electrode on the surface, said input and output electrodes being in comb shape and opposing each other; a sound absorbing resin layer formed on at least part of the bottom surface of said piezoelectric substrate; and an adhesive resin layer in contact with said sound absorbing resin layer and said piezoelectric substrate for adhering said piezoelectric substrate to a stem.

According to this device, at least three layers and two interfaces are formed by the sound absorbing resin layer and the adhesive resin layer in the direction of propagation of the surface wave of the piezoelectric substrate, that is, in the horizontal direction, and at least two layers and one interface are formed by the sound absorbing resin layer and the adhesive resin layer in the direction from the top surface to the bottom surface of the piezoelectric substrate, that is, in the vertical direction.

According to the elastic surface wave device of the above construction, the bulk wave heading toward the stem through the piezoelectric substrate is absorbed on its way by both of the sound absorbing resin layer and the adhesive resin layer or the former alone, so that the bulk wave does not reflect at the surface of the stem, does not enter the piezoelectric substrate and does not reach the output electrode, thereby eliminating degradation in the frequency characteristics of the device.

The bulk wave heading along the direction of propagation of the surface wave in the sound absorbing resin layer and the adhesive resin layer (in the horizontal direction) is multi-refracted by at least three layers and two interfaces. This causes interfering irregular reflection so that the absorption of the bulk wave may be increased. The bulk wave heading from the top surface to the bottom surface of the piezoelectric substrate in the sound absorbing resin layer and the adhesive resin layer (that is, in the vertical direction) is multi-refracted by at least two layers and one interface so that the absorption of the bulk wave may be increased in a similar manner. It is also possible to match the acoustic impedances of the respective layers by suitably controlling the materials of the sound absorbing resin layer and the adhesive resin layer. In this case, the reflection of the bulk wave at the interfaces between the respective layers may be prevented. According to the present invention, although the adhesion of the absorbing resin layer is smaller than that of the adhesive resin layer, the sound absorbing effects of the sound absorbing resin are greater than those of the adhesive resin.

In the present invention, the absorbing resin layer may have a thickness of from 20 to 40 $\mu$m and the adhesive resin layer may have a thickness of from 10 to 40 $\mu$m.

DESCRIPTION OF THE PREFERRED EMBODIMENTS

The embodiments of the elastic surface wave filter of the present invention will now be described with reference to FIGS. 2 to 9. In these figures, the direction of propagation of the surface wave of the piezoelectric substrate (i.e., the horizontal direction) will be designated by arrow X, and the direction from the top surface to the bottom of the piezoelectric substrate (i.e., the vertical direction) will be designated by arrow Y.

Figure 1:
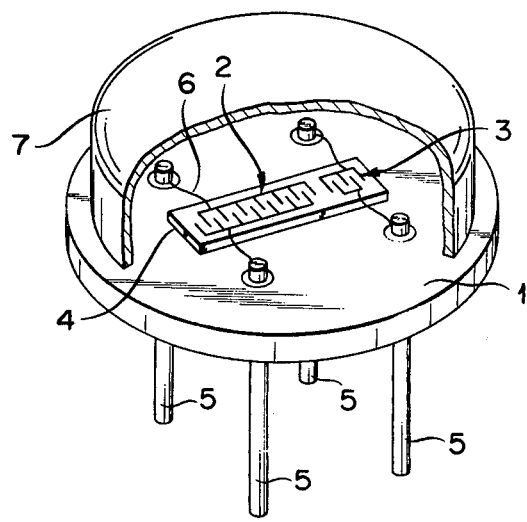
FIG. 1 is a perspective view of a conventional elastic surface wave filter with part being cut away.
Figure 2:
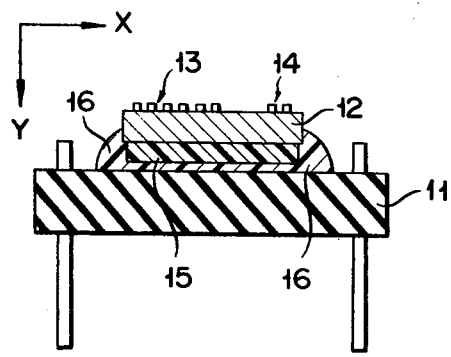
FIGS. 2 to 9 are sectional views of the embodiments of the elastic surface wave filter of the present invention.

In a surface wave filter as shown in FIG. 2, a sound absorbing resin layer 15, for example, made of phenolic resin of the same surface area as a piezoelectric substrate 12 is formed below the bottom surface of the substrate 12. Said phenolic resin may further contain sulfur particles. An adhesive resin layer 16, for example, made of two-part system epoxy adhesive of slightly larger area is formed on a stem 11. The adhesive resin extends to the side surfaces of the substrate 12 to adhere the substrate 12 to the stem 11. The sound absorbing resin layer and the adhesive resin layer form three layers and two interfaces in the X direction and two layers and one interface in the Y direction.

Figure 3:
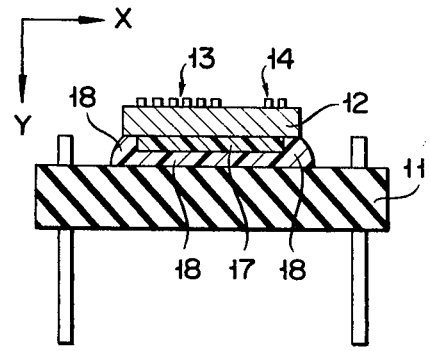

In a surface wave filter as shown in FIG. 3, a dsound absorbing resin layer 17 having a smaller area than that of the piezoelectric substrate 12 is formed below the bottom surface of the substrate 12, and covers at least the embedded part of an input electrode 13 and an output electrode 14. An adhesive resin layer 18 is formed on the stem 11 so as to be wider than the sound absorbing resin layer 17. The part of the adhesive resin layer 18 outside the sound absorbing layer 17 adheres to the bottom surface of the substrate 12 to bond the substrate 12 to the stem 11. The sound absorbing resin layer and the adhesive resin layer form three layers and two interfaces in the X direction and two layers and one interface in the Y direction.

Figure 4:
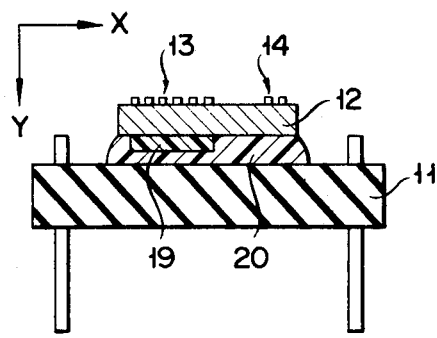

In a surface wave filter as shown in FIG. 4, a sound absorbing resin layer 19 is formed on the part of the bottom surface of the substrate 12 which opposes the input electrode 13. An adhesive resin layer 20 is formed on the stem 11 in such a manner that it adheres to the rest of the bottom surface of the substrate to bond the substrate 12 to the stem 11. The sound absorbing resin layer and the adhesive resin layer form three layers and two interfaces in the X direction and two layers and one interface in the Y direction.

Figure 5:
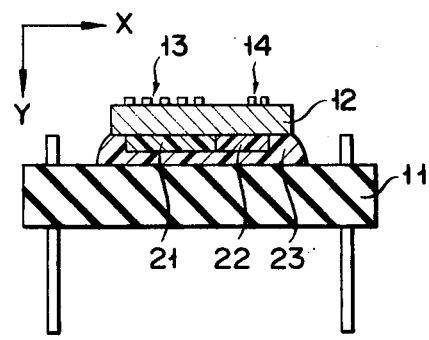

In a surface wave filter as shown in FIG. 5, a first sound absorbing resin layer 21 is formed below the bottom surface of the substrate, at least at a part which opposes the input electrode 13. A second sound absorbing resin layer 22 of a different material from that of the first sound absorbing resin layer is formed at least at a part which opposes the output electrode 14. An adhesive resin layer 23 is formed on the stem 11 to adhere to the remaining part of the bottom surface of the substrate outside the two sound absorbing resin layers, thereby bonding the substrate 12 to the stem 11. The sound absorbing resin layers and the adhesive resin layer form four layers and three interfaces in the X direction and two layers and one interface in the Y direction.

Figure 6:
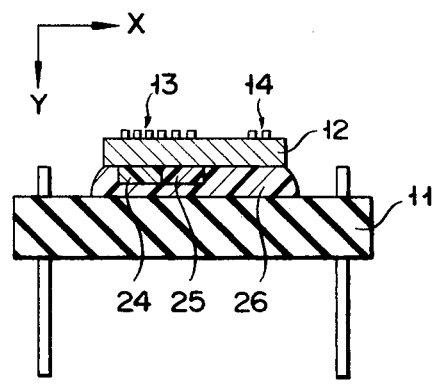

In a surface wave filter as shown in FIG. 6, sound absorbing resin layers 24 and 25 of different materials are formed below the part of the bottom surface of the substrate 12 which opposes the input electrode 13. An adhesive resin layer 26 is formed on the stem 11 for adhesion with the part of the bottom surface of the substrate outside the sound absorbing resin layers 24 and 25, thereby bonding the substrate 12 to the stem 11. The sound absorbing resin layers and the adhesive resin layer form four layers and three interfaces in the X direction and two layers and one interface in the Y direction.

Figure 7:
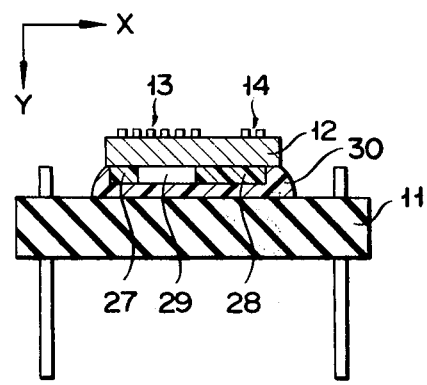

In a surface wave filter as shown in FIG. 7, sound absorbing resin layers 27 and 28 are formed at least below parts of the bottom surface of the substrate 12 which oppose the input electrode 13 and the output electrode 14. A space 29 is formed below the input electrode 13 and next to the sound absorbing resin layer 27. An adhesive resin layer 30 is formed on the stem 11 for adhesion with the part of the bottom surface of the substrate outside the sound absorbing resin layers and the space 29, thereby bonding the substrate 12 to the stem 11. The sound absorbing resin layers and the adhesive resin layer form four layers and two interfaces in the X direction and two layers and one interface in the Y direction.

Figure 8:
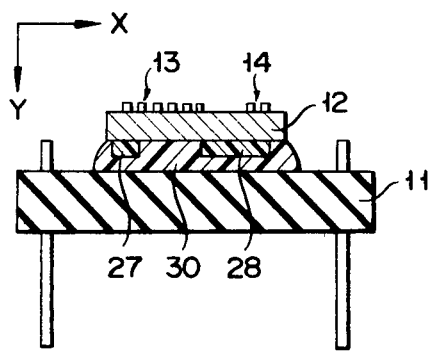

In a surface wave filter as shown in FIG. 8, the space 29 of the surface wave filter of the embodiment shown in FIG. 7 is filled with the adhesive resin, and the sound absorbing layers and the adhesive resin layer form five layers and four interfaces in the X direction and two layers and one interface in the Y direction.

Figure 9:
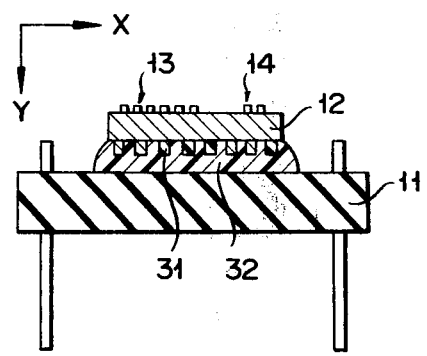

In a surface wave filter as shown in FIG. 9, discontinuous dot-shaped sound absorbing resin layers 31 are formed below the bottom surface of the substrate 12. An adhesive resin layer 32 is formed on the stem 11. The adhesive resin layer is adhered to the part of the bottom surface of the substrate outside the sound absorbing resin layers 31, thereby bonding the substrate 12 to the stem 11. The sound absorbing resin layers and the adhesive resin layer form many layers and interfaces in the X direction and two layers and one interface in the Y direction.

Although the adhesive resin layers shown in FIG. 9 are dot-shaped, the present invention is not limited to this particular construction. For example, they may constitute a discontinuous strip or network structure.

The effects of the surface wave filter formed and described with reference to the drawings will be described below.

According to the surface wave filter shown in FIG. 2, the bulk wave which passes through the bottom surface of the piezoelectric substrate 12 tends to be attenuated since the sound absorbing resin layer 15 is present at a part where the energy of the bulk wave is high. Further, since the sound absorbing resin layer 15 and the adhesive resin layer 16 form three layers and two interfaces, irregular reflection increases so that the level of the bulk wave reaching the output electrode may be effectively weakened. When the acoustic impedances of the sound absorbing resin layer and the adhesive resin layer are the same, the traveling wave of the bulk wave alone is present in the sound absorbing layer 15 below the piezoelectric substrate bottom surface, so that there is no reflected wave or stationary wave, and the bulk wave response becomes small. Such control of the acoustic impedance is impossible with a surface wave filter having the adhesive resin layer alone. However, with this embodiment, the control of the bulk wave is possible and the frequency characteristics may be improved. The energy of the bulk wave which passes through the sound absorbing resin layer 15 and the adhesive resin layer 16 is largely dissipated by the time the bulk wave reaches the surface of the stem 11. Thus, even when the bulk wave is reflected at the stem, it is attenuated, and there is only a small chance that the bulk wave which passes in the reverse direction and reaches the output electrode will be converted into an electric signal.

According to the surface wave filter shown in FIG. 3, the same effects of decreasing the bulk wave response level at the output side as obtained with the surface wave filter shown in FIG. 2 may be obtained. Further, since the part of the adhesive resin layer 18 which adheres to the bottom surface of the substrate as shown in the figure is greater, attenuation of the bulk wave is facilitated and the adhesion between the substrate 12 and the stem 11 is improved.

According to the surface wave filter shown in FIG. 4, since the bulk wave is generated at the input side, its energy is particularly great below the input electrode 13. Due to this, the sound absorbing resin layer 19 is formed at the part of the bottom surface of the substrate 12 immediately below the input electrode 13 to attenuate the bulk wave. The adhesive resin layer 20 adheres to the rest of the bottom surface of the substrate 12.

According to the surface wave filter shown in FIG. 5, two sound absorbing resin layers of different materials are formed in the X direction so that it is easy to match the acoustic impedance in the X direction. Thus, only the traveling wave is present along the path of the bulk wave, and the generation of a stationary wave is suppressed. Further, since there is a refractive interface, the irregular reflection phenomenon may be utilized, enhancing the bulk wave suppressing effects. The propagation of the bulk wave may be adequately suppressed by properly selecting the material of the sound absorbing resin layers in the X and Y directions.

The surface wave filter shown in FIG. 6 is a modification of the surface wave filter shown in FIG. 5 and is of a structure for preventing degradation of the adhesion between the stem and the substrate. Suppression of the bulk wave may be performed in a similar manner as in the case of FIG. 5.

In the embodiments described above, the sound absorbing resin layers and the adhesive resin layer are formed below the part of the bottom surface of the substrate which opposes the input electrode. These resins have certain dielectric constants and provide an electrostatic capacitance between the input electrode and the stem. When this electrostatic capacitance increases, the bulk wave excitation is facilitated. Further, the electrostatic capacitance will mismatch with the circuit constant if it is not regulated. It thus becomes necessary to suppress variation of the electrostatic capacitance. However, when the sound absorbing resin layers and the adhesive resin layer are formed below the bottom surface of the substrate in a complex manner, the above-described dielectric constants fluctuate and the electrostatic capacitance also becomes unstable. These problems are not present with the surface wave filter shown in FIG. 7 wherein the dielectric body is not present in the part of the bottom surface of the substrate 12 opposing the input electrode 13, but a space is formed there instead. Further, since the sound absorbing resin layers and the adhesive resin layers are formed in various places along the X and Y directions, the attenuation of the bulk wave may be satisfactorily achieved.

According to the surface wave filter shown in FIG. 8, the adhesive resin is filled in the part where the space 29 is formed in the surface wave filter shown in FIG. 7. Since the embodiment of FIG. 8 is of a multi-layer structure in the X direction, with the adhesive resin layer 30, the sound absorbing resin layer 27, the adhesive resin layer 30, and so on, the bulk wave may be attenuated satisfactorily. Since the adhesive resin layer 30 adheres well to the bottom surface of the substrate 12 and the sound absorbing resin layer is partially absent from part of the bottom surface of the substrate opposing the input electrode 13, the adhesion between the substrate and the stem is good and the variation in the electrostatic capacitances is small, so that the characteristics may be improved.

According to the surface wave filter shown in FIG. 9, dot-shaped sound absorbing resin layers 31 are formed below the bottom surface of the substrate 12, and many sound absorbing resin layers and adhesive resin layers are alternately adhered to the bottom surface of the substrate. Since there is no continuous plate, the irregular reflection of the bulk wave is increased so that propagation of the bulk wave may be well suppressed, the adhesion between the substrate 12 and the stem 11 is improved, and a surface wave filter of excellent characteristics may be obtained.

Although description has been made with respect to a surface wave filter having two layers in the Y direction, a sound absorbing resin layer and an adhesive resin layer, the same effects may be obtained with more than two layers.

What we claim is:

1. An elastic surface wave device comprising:
a piezoelectric substrate having first and second surfaces;
an input electrode and an output electrode on the first surface;
the input and output electrodes being in comb shape and opposing each other;
a sound absorbing resin layer formed on at least part of the second surface of said piezoelectric substrate; and
an adhesive resin layer in contact with said sound absorbing resin layer and said piezoelectric substrate for adhering said piezoelectric substrate to a stem;
the sound absorbing resin layer and the adhesive resin layer being shaped and positioned so as to form at least three layers and two layer interfaces in a direction of propagation of a surface wave of said piezoelectric substrate and at least two layers and one layer interface in a direction from the first surface to the second surface of said piezoelectric substrate.

2. An elastic surface wave device comprising:
a piezoelectric substrate having first and second surfaces;
an input electrode and an output electrode on the first surface;
the input and output electrodes being in comb shape and opposing each other;
a sound absorbing resin layer formed on at least part of the second surface of said piezoelectric substrate; and
an adhesive resin layer in contact with said sound absorbing resin layer and said piezoelectric substrate for adhering said piezoelectric substrate to a stem;
the sound absorbing resin layer being formed on substantially the entire second surface of the piezoelectric substrate so that said sound absorbing resin layer and adhesive resin layer form three layers and two layer interfaces in a direction of propagation of a surface wave of said piezoelectric substrate and two layers and one layer interface in a direction from the first surface of the second surface of the piezoelectric substrate.

3. An elastic surface wave device comprising:
a piezoelectric substrate having first and second surfaces;
an input electrode and an output electrode on the first surface;
the input and output electrodes being in comb shape and opposing each other;
a sound absorbing resin layer formed on at least part of the second surface of said piezoelectric substrate; and
an adhesive resin layer in contact with said sound absorbing resin layer and said piezoelectric substrate for adhering said piezoelectric substrate to a stem;
the sound absorbing resin layer being formed contiguous with a region of the second surface of the substrate which opposes an input electrode forming region on the first surface, with a region of the second surface which opposes an output electrode forming region of the first surface, and with a region of the second surface surrounded by these second surface regions so that sound adsorbing resin layer and said adhesive resin layer form three layers and two layer interfaces in a direction of propagation of a surface wave of said piezoelectric substrate and two layers and one layer interface in a direction from the first surface of the second surface of said piezoelectric substrate.

4. An elastic surface wave device comprising:
a piezoelectric substrate having first and second surfaces;
an input electrode and an output electrode on the first surface;
the input and output electrodes being in comb shape and opposing each other;
a sound absorbing resin layer formed on at least part of the second surface of said piezoelectric substrate; and
an adhesive resin layer in contact with said sound absorbing resin layer and said piezoelectric substrate for adhering said piezoelectric substrate to a stem;
wherein the sound absorbing resin layer is formed on a region of the second surface of the substrate opposing the input electrode on the first surface thereof so that the sound absorbing resin layer and the adhesive resin layer form three layers and two layer interfaces in a direction of propagation of a surface wave of the substrate and two layers and one layer interface in a direction from the first to the second surface of the substrate.

5. A device according to claim 4 wherein the front half of said sound absorbing resin layer comprises a first sound absorbing resin layer and the remaining half comprises a second sound absorbing resin layer of a material different from that of said first sound absorbing resin layer, so that said first and second sound absorbing resin layers and said adhesive resin layer form four layers and three interfaces in the direction of propagation of the surface wave, and two layers and one interface in the direction from the top surface to the bottom surface of said substrate.

6. An elastic surface wave device comprising:
a piezoelectric substrate having first and second surfaces;
an input electrode and an output electrode on the first surface;
the input and output electrodes being in comb shape and opposing each other;
a sound absorbing resin layer formed on at least part of the second surface of said piezoelectric substrate; and
an adhesive resin layer in contact with said sound absorbing resin layer and said piezoelectric substrate for adhering said piezoelectric substrate to a stem;
the sound absorbing resin layer comprising first and second sound absorbing resin layers, the first sound absorbing resin layer being formed on a region of the second surface of the substrate opposing the input electrode and the second sound absorbing resin layer being formed of a material different from that of the first sound absorbing resin layer and formed on a region of the second surface of the substrate opposing the output electrode and being in contact with the first sound absorbing resin layer,
the first and second sound absorbing layers and adhesive resin layer being shaped and positioned so as to form four layers and three layer interfaces in a direction of propagation of a surface wave of said substrate and so as to form two layers and one layer interface in a direction from the first to the second surface of the substrate.

7. An elastic surface wave device comprising:
a piezoelectric substrate having first and second surfaces;
input and output electrodes being of comb shape and opposing each other;
a sound absorbing resin layer formed on at least part of the second surface of said piezoelectric substrate; and
an adhesive resin layer in contact with said sound absorbing resin layer and said piezoelectric substrate for adhering said piezoelectric substrate to a stem,
wherein the sound absorbing resin layer comprises first and second sound absorbing layers, the first sound absorbing resin layer being formed on a region of the second surface of the substrate opposing part of the input electrode and the second sound absorbing resin layer being formed on a region of the second surface of the substrate opposing the output electrode, there being a space formed between the two sound absorbing resin layers opposing part of the input electrode, the first and second sound absorbing resin layers and adhesive resin layer being shaped and positioned so as to form four layers and two layer interfaces in a direction of propagation of a surface wave and two layers and one layer interface in a direction from the top to the bottom surface of the substrate.

8. A device according to claim 7, wherein an adhesive layer is filled in said space so that the adhesive resin layer and the two sound absorbing resin layers form five layers and four interfaces in the direction of propagation of the surface wave, and two layers and one interface in the direction from the top surface to the bottom surface of said substrate.

9. An elastic surface wave device comprising:
a piezoelectric substrate having first and second surfaces;
an input electrode and an output electrode on the first surface;
the input and output electrodes being in comb shape and opposing each other;
a sound absorbing resin layer formed on at least part of the second surface of said piezoelectric substrate; and
an adhesive resin layer in contact with said sound absorbing resin layer and said piezoelectric substrate for adhering said piezoelectric substrate to a stem;
wherein the sound absorbing resin layer comprises a plurality of sound absorbing resin layers formed discontinuously on the second surface of the substrate, the plurality of sound absorbing resin layers and the adhesive resin layer being shaped and positioned so that there are formed a plurality of layers and a plurality of interfaces in a direction of propagation of a surface wave along the substrate and two layers and one layer interface in a direction from the top surface to the bottom surface of the substrate.

* * * * *